(12) United States Patent
Measor et al.

(10) Patent No.: US 10,249,546 B2
(45) Date of Patent: Apr. 2, 2019

(54) REVERSE DECORATION FOR DEFECT DETECTION AMPLIFICATION

(71) Applicant: KLA-Tencor Corporation, Milpitas, CA (US)

(72) Inventors: Philip Measor, San Jose, CA (US); Robert Danen, Pleasanton, CA (US); Paul MacDonald, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/390,473

(22) Filed: Dec. 24, 2016

(65) Prior Publication Data

US 2018/0025952 A1    Jan. 25, 2018

Related U.S. Application Data

(60) Provisional application No. 62/364,498, filed on Jul. 20, 2016.

(51) Int. Cl.
| | | |
|---|---|---|
| *H01L 21/66* | (2006.01) | |
| *H01L 21/306* | (2006.01) | |
| *G01R 31/28* | (2006.01) | |
| *H01L 27/11582* | (2017.01) | |

(52) U.S. Cl.
CPC .......... *H01L 22/22* (2013.01); *G01R 31/2898* (2013.01); *H01L 21/30608* (2013.01); *H01L 21/30625* (2013.01); *H01L 22/12* (2013.01); *H01L 22/24* (2013.01); *H01L 27/11582* (2013.01)

(58) Field of Classification Search
None
See application file for complete search history.

(56) References Cited

U.S. PATENT DOCUMENTS

| | | |
|---|---|---|
| 6,103,539 A | 8/2000 | Schaffer et al. |
| 6,403,385 B1 | 6/2002 | Venkatkrishnan et al. |
| 6,714,031 B2 | 3/2004 | Seki |
| 9,250,513 B2 | 2/2016 | Yu et al. |
| 2005/0082651 A1 | 4/2005 | Farnworth et al. |
| 2006/0037941 A1 | 2/2006 | Weng et al. |
| 2008/0311283 A1 | 12/2008 | Brasack et al. |
| 2011/0080180 A1 | 4/2011 | Lavoie et al. |
| 2011/0121456 A1* | 5/2011 | Caron ................... H01L 21/486 257/741 |
| 2012/0113416 A1 | 5/2012 | Lange et al. |
| 2015/0260660 A1* | 9/2015 | Lange ................ G01N 21/9501 356/237.5 |

(Continued)

OTHER PUBLICATIONS

ISA/KR, International Search Report for PCT/US2017/041745 dated Nov. 27, 2017.

(Continued)

*Primary Examiner* — Alexander G Ghyka
(74) *Attorney, Agent, or Firm* — Hodgson Russ LLP

(57) ABSTRACT

Reverse decoration can be used to detect defects in a device. The wafer can include NAND stacks or other devices. The defect can be a channel bridge, a void, or other types of defects. Reverse decoration can preserve a defect and/or can improve defect detection. A portion of a layer may be removed from a device. A layer also may be added to the device, such as on the defect, and some of the layer may be removed.

5 Claims, 12 Drawing Sheets

(56) References Cited

U.S. PATENT DOCUMENTS

2016/0111307 A1* 4/2016 Davis ............... H01J 37/32935
　　　　　　　　　　　　　　　　　　　　　　438/16

OTHER PUBLICATIONS

Kim et al., A novel approach for scratch detection and study on dependency of scratches during oxide CMP, International Conference on Planarization/CMP Tecchnology, Fukuoka, pp. 307-312, Nov. 19, 2009.

* cited by examiner

REVERSE DECORATION FOR DEFECT DETECTION AMPLIFICATION

CROSS-REFERENCE TO RELATED APPLICATIONS

This application claims priority to the provisional patent application filed Jul. 20, 2016 and assigned U.S. App. No. 62/364,498, the disclosure of which is hereby incorporated by reference.

FIELD OF THE DISCLOSURE

This disclosure relates to defect detection.

BACKGROUND OF THE DISCLOSURE

Wafer inspection systems help a semiconductor manufacturer increase and maintain integrated circuit (IC) chip yields by detecting defects that occur during the manufacturing process. One purpose of inspection systems is to monitor whether a manufacturing process meets specifications. The inspection system indicates the problem and/or the source of the problem if the manufacturing process is outside the scope of established norms, which the semiconductor manufacturer can then address.

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for a semiconductor manufacturer.

Defect detection is becoming increasingly challenging as the semiconductor industry shrinks designs, adds new materials, or constructs new structures to increase density of transistors or memory elements. Defects are becoming smaller, have lower optical contrast, or are in noisier optical surroundings. Tools have been developed to use shorter wavelengths to improve resolution and optical contrast, to include features to filter out noise (e.g., using particular apertures, algorithms, or feature vectors), or to have increased light intensity to improve the optical signal. Despite these efforts, the ability to detect such defects with traditional approaches has increasingly long time-to-market or is becoming prohibitively more expensive to develop.

Recent solutions have attempted to address these issues. These include new light sources or features to filter out noise. However, current methods have difficulty keeping pace with technological advances and gaps in detection occur. For some gap defects, there is no known optical solution and the only alternatives are large amount of time using a scanning electron microscope (SEM) or electronic tests (eTest). For example, eTest is disclosed in U.S. Pat. No. 6,714,031, which is incorporated by reference in its entirety. Tool improvement alone may be insufficient to address all gaps in the ability to detect such defects. Even if detection with an advanced tool design is possible, the tool performance may be unable to keep pace with advanced semiconductor designs. Therefore, changes in manufacturing processes may be needed.

Semiconductor manufacturers have developed alternate solutions to allow optical inspection tools to detect defects. Semiconductor manufacturers have introduced additional process steps to more easily detect challenging defects (especially if there are no better alternatives) despite the additional process control that is required. One example is called "decoration" where semiconductor manufacturers deposit or remove materials that have high optical contrast to amplify detection of low contrast defects. For example, a post-$SiO_2$ chemical mechanical planarization (CMP) layer consists of glass on top of logic transistors. It can be difficult to detect any small micro scratches due to low optical contrast and the small size of the defect. The defect can be easier to detect when a defect is decorated by etching material away. Other examples of methods to decorate wafers have been developed. However, even these alternate solutions cannot detect all defects.

Decoration cannot detect all defects simply by depositing material or by removing material. SEMs can find some of these difficult-to-detect defects, but SEM images take a long time to acquire for all defects on a wafer and cannot provide wafer signatures used for root cause analysis. Processing for eTest is costly due to the large number of process steps required.

Therefore, improved methods of defect detection are needed.

BRIEF SUMMARY OF THE DISCLOSURE

In a first embodiment, a method is provided. The method comprises applying a layer of a material on a surface of a wafer such that a defect on the wafer is covered with the layer. The material is configured to amplify detection of the defect. A first portion of the layer is removed. A second portion of the layer is configured to remain disposed on the defect after the removing. The defect may be a void, a bridge, or a separation. The material may be silicon nitride, polysilicon, titanium dioxide, amorphous carbon, hafnium oxide, magnesium oxide, aluminum oxide, silicon carbide, tantalum pentoxide, or a combination thereof. The second portion of the layer remaining disposed on the defect may have a thickness from 1 nm to 500 nm.

The removing can include at least one of etching or chemical mechanical planarization. The applying can include depositing.

The material can be further configured to preserve the defect during the removing.

In an instance, the surface includes at least one NAND stack. In another instance, the surface includes at least one structure containing copper or tungsten, and the defect is disposed in the structure.

The method may further comprise detecting the defect after the removing.

In a second embodiment, a method is provided. The method comprises applying a layer of a material on a surface of a wafer such that a defect on the wafer is covered with the layer. The surface of the wafer includes a plurality of NAND stacks. The material is configured to amplify detection of the defect. A first portion of the layer is removed. A second portion of the layer is configured to remain disposed on the defect after the removing. The material may be silicon nitride, polysilicon, titanium dioxide, amorphous carbon, hafnium oxide, magnesium oxide, aluminum oxide, silicon carbide, tantalum pentoxide, or a combination thereof. The second portion of the layer remaining disposed on the defect may have a thickness from 1 nm to 500 nm.

In an instance, the defect is a void in a wall of one of the NAND stacks. The applying includes isotropic deposition on the walls of the NAND stacks and the removing includes isotropic etching of the walls of the NAND stacks.

In another instance, the defect is a bridge structure between two of the NAND stacks. The applying includes anisotropic deposition on the walls of the NAND stacks and the removing includes isotropic etching of the walls of the NAND stacks.

In a third embodiment, a method is provided. The method comprises providing a wafer including a NAND stack with a defect. The defect is a void in a wall of the NAND stack. Some tungsten is removed from the NAND stack. Removing the tungsten is configured to expose a surface of a pillar in the NAND stack. Silicon is removed from the NAND stack. Removing the silicon forms a void in the pillar. A remainder of the tungsten is removed from the NAND stack.

Removing the tungsten may include an isotropic etch. Some of the tungsten may be configured to remain on the NAND stack after removing the tungsten.

Removing the silicon may include an etch.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Methods to amplify defect detection by a technique referred to as "reverse decoration" are disclosed. Reverse decoration is a process flow of adding and/or removing metal, semiconductor, or dielectric material to amplify the detection of gap defects. Instead of only adding material or only removing material to amplify defect detection, material may be added to preserve the defect or transfer a gap defect for later optical detection. Material that limits defect optical detection can be removed to amplify optical defect detection. Detection of defects is increased on current layers or devices. Detection gaps in new devices that are being developed also can be addressed. The methods disclosed herein are faster and less expensive than existing techniques and can detect defect types that cannot be detected using existing techniques. Noise sources that inhibit detection are reduced or eliminated.

Furthermore, the methods disclosed herein can detect defects that existing optical techniques are incapable of detecting. Existing techniques to "decorate" gap defects so that they can be detected cannot be applied to all types of defects. For example, there are no known optical inspection solutions for key gap defects, such as a tungsten void. A potential detection solution for these types of defects is eTest, but eTest is expensive and can only be performed after additional processing or after additional layers are formed.

Figure 1:
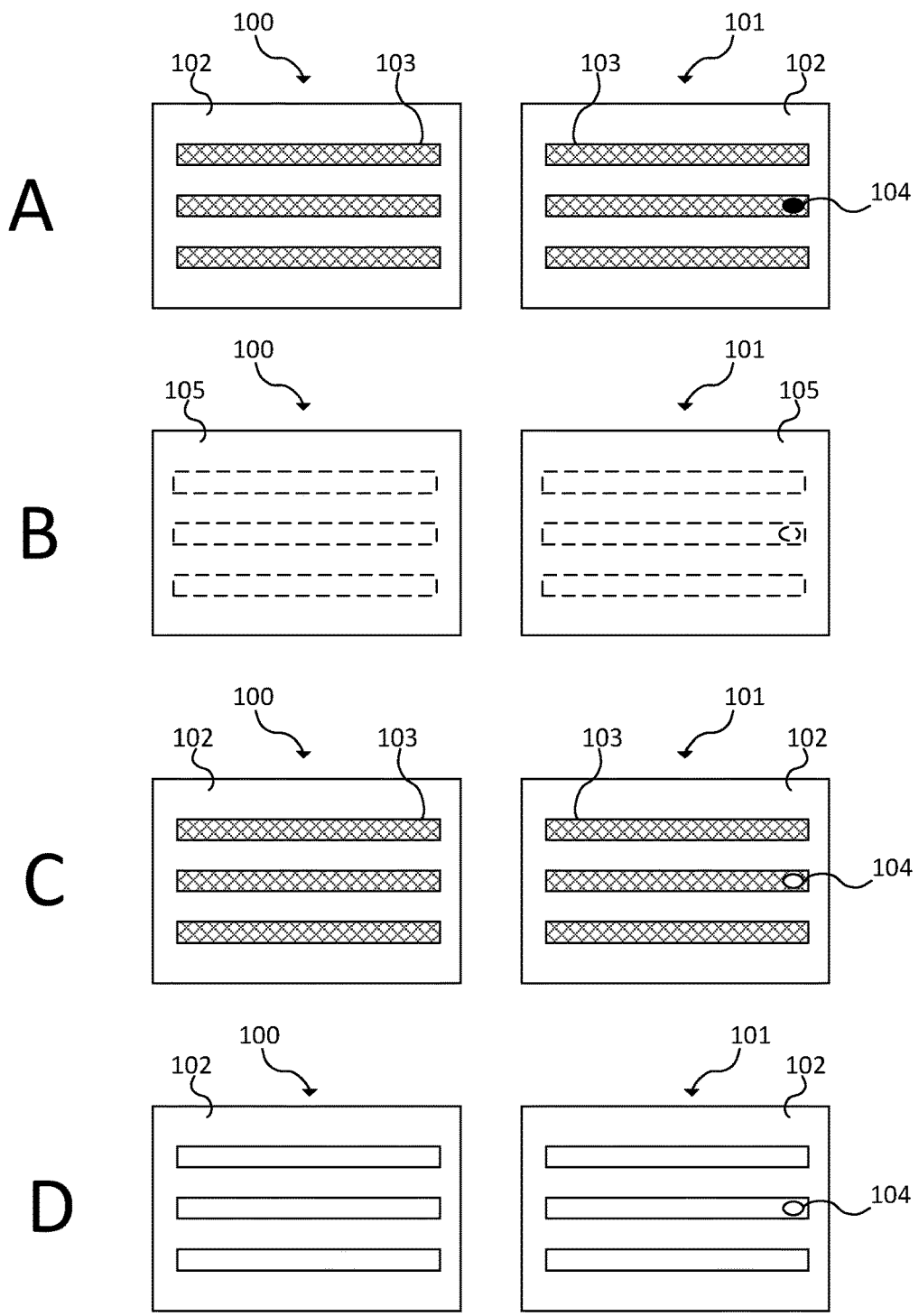
FIG. 1 is an embodiment of a process flow in accordance with the present disclosure.

FIG. 1 is an embodiment of a process flow. The example in FIG. 1 is for 2D logic on an M1 copper CMP layer, though it could be performed on other devices or structures. FIG. 1 represents a top view.

The design density increases as designs shrink, which increases noise in the same area. This is particularly problematic for the M1 copper CMP layer where noise dominates thereby limiting copper void detection. One known optical solution defined at least one small care area to eliminate surrounding noise, but many voids are still missed. Small care areas can eliminate noise by eliminating noise sources from surrounding noise sources (e.g., different structures). Some voids still may be missed because noise sources exist within the area considered despite the elimination of the noise.

FIG. 1 show the top view of a device 100 and a device 101. As seen in FIG. 1A, both the device 100 and device 101 include a wafer 102 with copper structures 103. The copper structures 103 may be copper lines that have been filled or other types of structures. The copper structures 103 generate high amounts of optical noise during inspection. Other structures or materials, such as an unfilled tungsten contact, also may generate high amounts of optical noise during inspection.

The device 101 also includes defect 104, which is difficult to detect due to the optical noise produced by the copper structures 103 during inspection. The metal line structure can have dimension variation or granules that may show up as noise in the images acquired. The defect 104 may be a void or other type of defect. The defect may have dimensions from 10-100 nm, though other dimensions are possible. A void in a copper structure can kill a device.

To provide a baseline, a layer 105 of polysilicon or some other high contrast refractive index material is added in FIG. 1B on both the device 100 and device 101. Other high contrast refractive index materials that can be used include silicon nitride ($Si_xN_y$), titanium dioxide ($TiO_2$), amorphous carbon, hafnium oxide ($HfO_2$), magnesium oxide (MgO), aluminum oxide ($Al_2O_3$), silicon carbide (SiC), tantalum pentoxide ($Ta_2O_5$), or combinations thereof (e.g., with polysilicon). The polysilicon or other high contrast refractive index material has a different refractive index (n) than the surrounding medium. For example, the polysilicon or other high contrast refractive index material may have n>2. For comparison, n of silicon oxide is approximately 1.25. The layer 105 of polysilicon fills in the defect 104. The layer 105 of polysilicon can be added using deposition or other techniques.

Some of layer 105 of polysilicon is removed using CMP in FIG. 1C. Enough of the layer 105 of polysilicon is removed to expose the copper structures 103. The defect 104 is still filled with the polysilicon 105. Thus, a portion of the layer 105 (e.g., a first layer) is removed and a portion of the layer 105 (e.g., a second portion) remains disposed on the defect 104.

If the noise between the silicon and copper does not provide sufficient contrast for defect detection, it can be followed by an optional metal-specific etch that eliminates the optical noise source. In FIG. 1D, the device 100 and device 101 are etched. This removes the copper structures 103. The polysilicon on the defect 104 remains in the copper void. After etching, the device 100 and device 101 resemble the Dummy Poly Remove layer which traditionally provide high detection sensitivity. The defect 104 is still filled with polysilicon, which provides high contrast. There is less optical noise in the device 101 of FIG. 1D than in the device 101 of FIG. 1A.

The M1 copper CMP reverse decoration example in FIG. 1 addresses provides higher sensitivity than use of care areas. In part, this may be due to elimination of the noise source in the copper.

Figure 2:
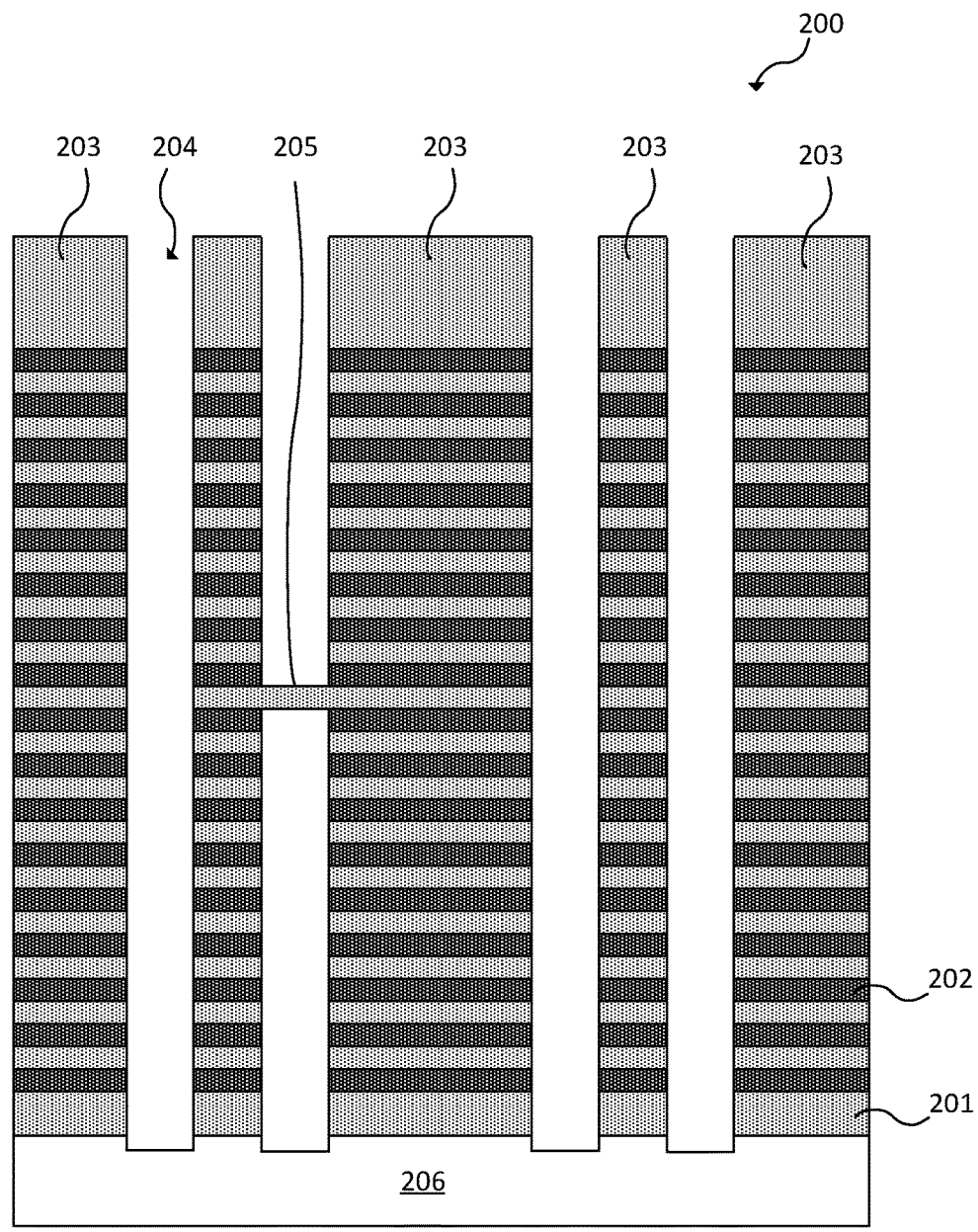
FIG. 2 is an exemplary cross-sectional view of a channel etch layer of a 3D NAND stack with a channel bridge.

FIG. 2 is an exemplary cross-sectional view of a channel etch layer of a 3D NAND stack 203 with a channel bridge 205. The NAND devices 200 include multiple 3D NAND stacks 203 separated by channels 204. For example, each 3D NAND stack 203 can be part of a flash memory. NAND flash memory is a type of non-volatile storage technology that does not require power to retain data. In an instance, the 3D NAND stack 203 is a 48-stack device.

The 3D NAND stacks 203 are disposed on a substrate 206, which may be silicon or other materials. The 3D NAND stacks 203 are made of alternating layers of silicon oxide 201 and silicon nitride 202. The materials in the various layers are designated using hatching or stippling. Other materials or other types of layers can be included. In the example of FIG. 2, the channel bridge 205 is made of silicon oxide 201. The exact position of the channel bridge 205 can vary, meaning that it can be at other height positions relative to the substrate 201 than as illustrated in FIG. 2.

Figure 3:
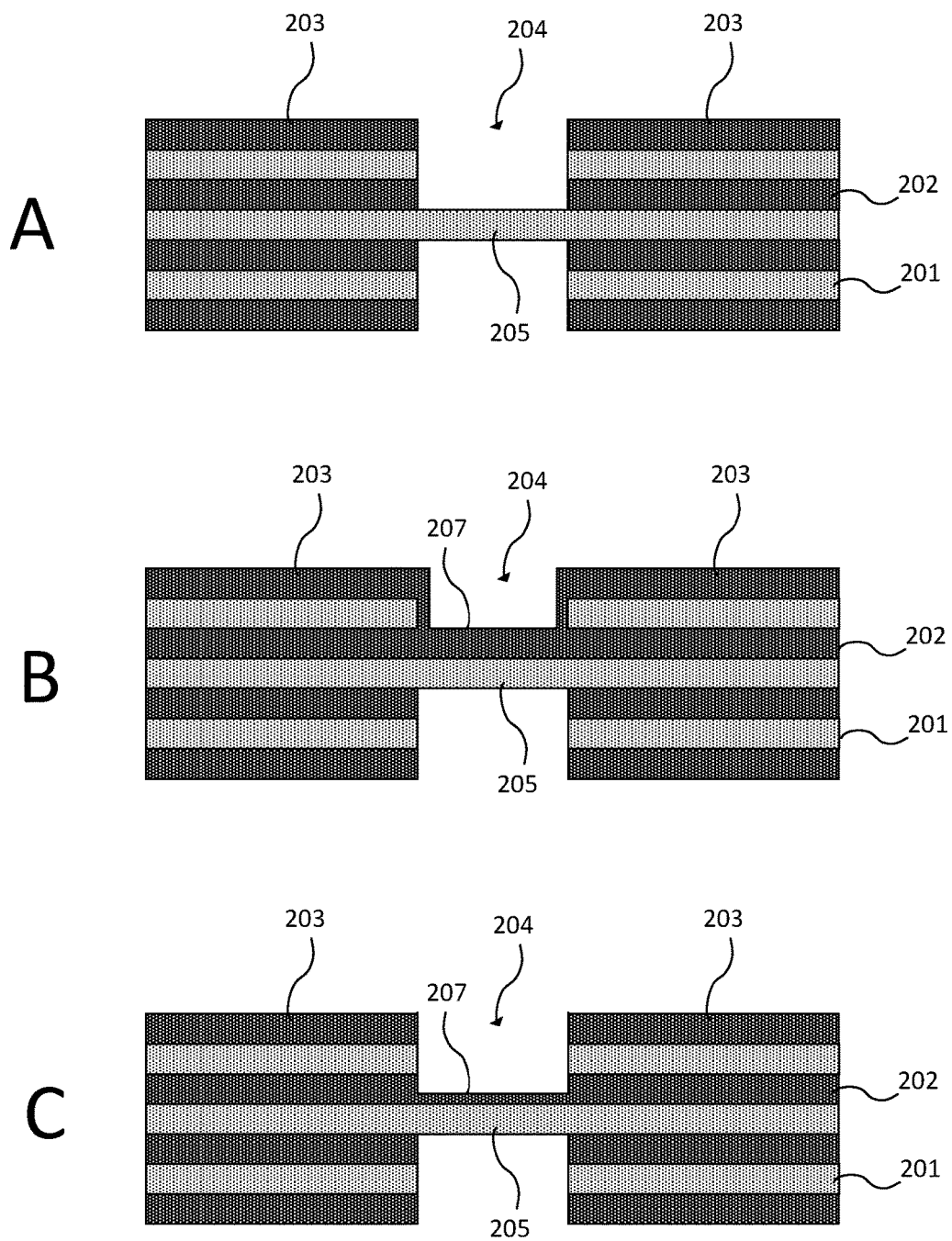
FIG. 3 is an embodiment of a process flow in accordance with the present disclosure using the 3D NAND stack of FIG. 2.

FIG. 3 is an embodiment of a process flow using the 3D NAND stack 203 of FIG. 2. In FIG. 3A, the channel bridge 205 is shown in the channel 204 between the 3D NAND stacks 203. In FIG. 3B, a layer 207 of material is added in the channel 204 on the channel bridge 205. The layer 207 may have a thickness from greater than 1 nm to 550 nm (including all ranges and values to the 0.1 nm therein), though other dimensions are possible. The channel bridge 205 may be partly or totally covered with the layer 207 of material. The layer 207 is added on both the channel bridge 205 and the walls of the 3D NAND stacks 203. The layer 207 may be added by, for example, anisotropic deposition. The thickness of the layer 207 may be larger on the channel bridge 205 than on the walls of the 3D NAND stack 203.

In this example, the layer 207 is silicon nitride. However, the layer 207 also can be polysilicon, titanium dioxide, amorphous carbon, hafnium oxide, magnesium oxide, aluminum oxide, silicon carbide, tantalum pentoxide, or combinations thereof (e.g., with silicon nitride). The layer 207 may be in the solid phase, can be compatible with the manufacturing process flow, and can be etched using, for example, anisotropic or isotropic etching. The layer 207 has a different n than the surrounding medium. For example, the layer 207 may have n>2. The layer 207 may provide high index contrast with the surrounding structure after further processing, such as after the tungsten is removed.

In FIG. 3C, a portion of the layer 207 is removed. Some of or a majority of the layer 207 is removed from the walls of the 3D NAND stacks 203. The removal may be, for example, an isotropic etch. A portion of the layer 207 remains on the channel bridge 205. Thus, a portion of the layer 207 is removed and a portion of the layer 207 remains disposed on the channel bridge 205. The portion of the layer 207 remaining on the channel bridge 205 after at least some is removed can have a thickness from, for example, 1 nm to 500 nm (including all ranges and values to the 0.1 nm therein). The removal may be configured to reduce damage to the silicon nitride layers 202 or other layers of the 3D NAND stacks 203. The layer 207 amplifies detection of the channel bridge 205. The channel bridge 205 can be preserved by the layer 207.

Figure 4:
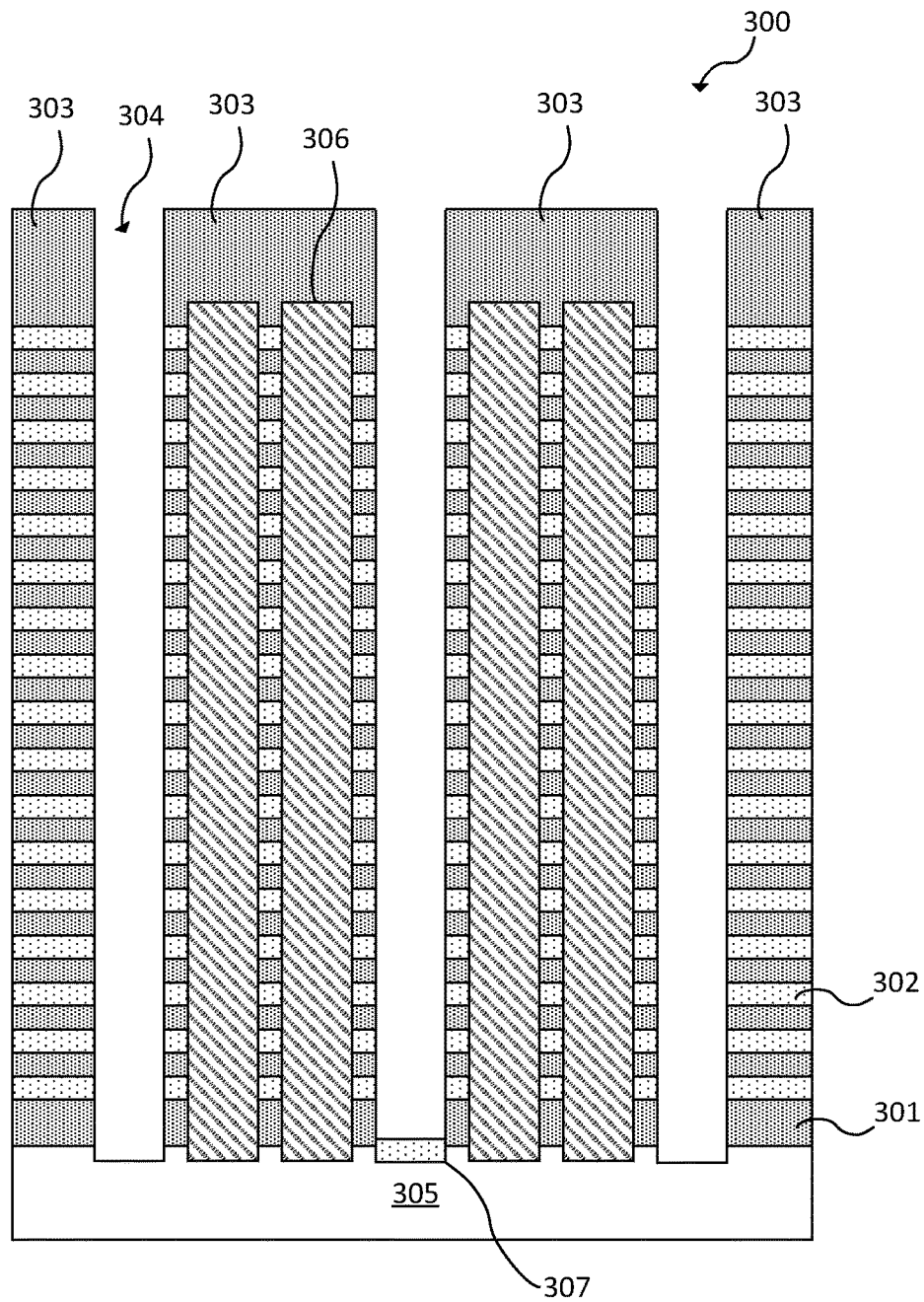
FIG. 4 is an exemplary cross-sectional view of a tungsten fill and etch layer of a 3D NAND stack with a separation structure.

FIG. 4 is an exemplary cross-sectional view of a tungsten fill and etch layer of a 3D NAND stack 303 with a separation structure 307. The 3D NAND stacks 303 are disposed on a substrate 305, which may be silicon or other materials. The 3D NAND stacks 303 are made of alternating layers of silicon oxide 301 and tungsten 302. The 3D NAND stacks 303 can include one or more pillars 306 made of polysilicon. The materials in the various layers are designated using hatching or stippling. Other materials or other types of layers can be included. In the example of FIG. 4, the separation structure 307 is made of tungsten and is on the substrate 305 in the base of the channel 304.

Figure 5:
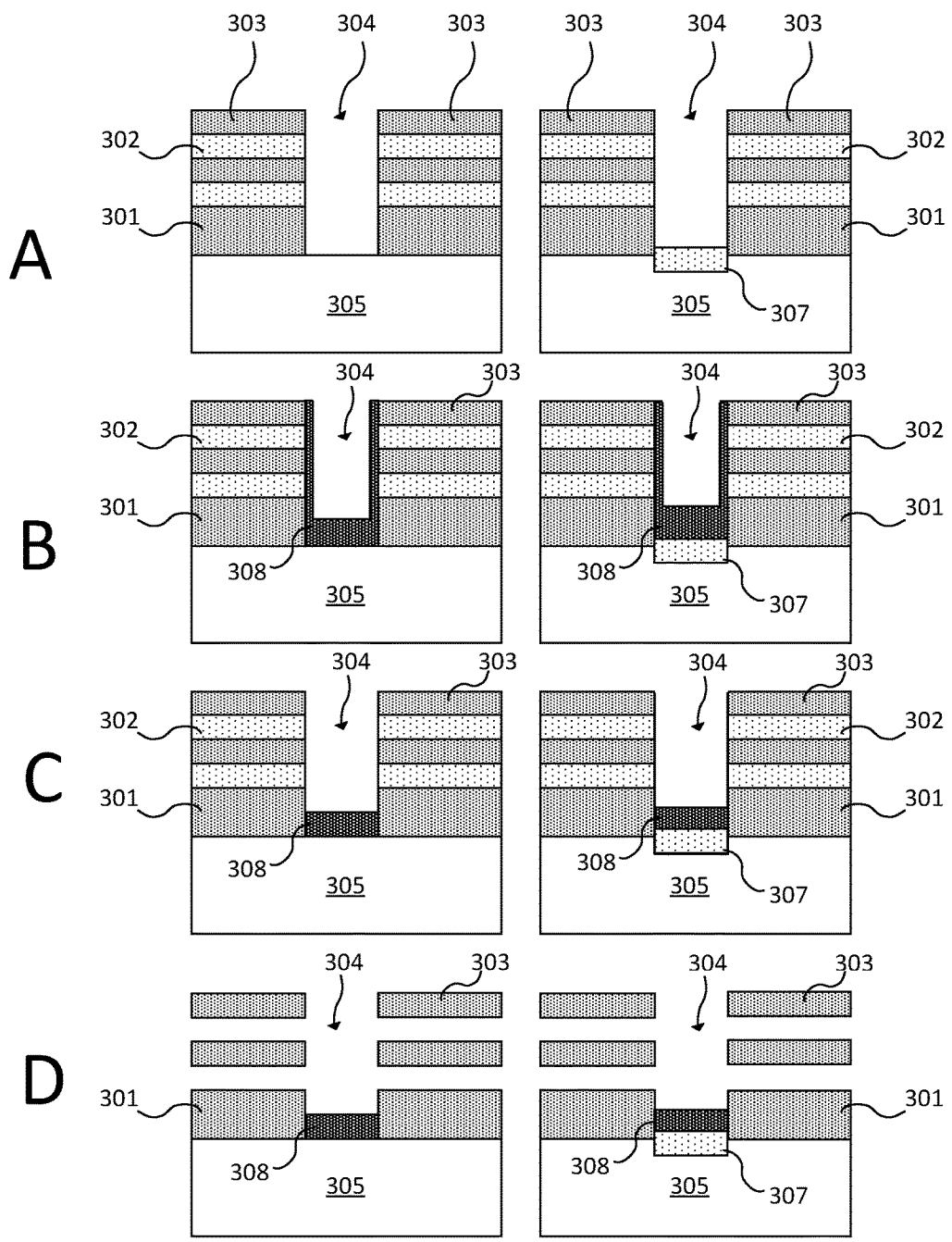
FIG. 5 is an embodiment of a process flow in accordance with the present disclosure using the 3D NAND stack of FIG. 4.

FIG. 5 is an embodiment of a process flow using the 3D NAND stack 303 of FIG. 4. As seen in FIG. 5A, two channels 304 are illustrated for comparison. One channel 304 includes a separation structure 307 and the other does not. In FIG. 5B, a layer 308 of material is added in the channel 304 on the base and walls of the 3D NAND stacks 303. The layer 308 may have a thickness from greater than 1 nm to 550 nm (including all ranges and values to the 0.1 nm therein), though other dimensions are possible. The layer 308 also is added on the separation structure 307. The layer 308 may be added by, for example, anisotropic deposition. The thickness of the layer 308 may be larger on the base of the channel 304 or on the separation structure 307 than on the walls of the 3D NAND stack 303.

In this example, the layer 308 is silicon nitride. However, the layer 308 also can be polysilicon, titanium dioxide, amorphous carbon, hafnium oxide, magnesium oxide, aluminum oxide, silicon carbide, tantalum pentoxide, or combinations thereof (e.g., with silicon nitride). The layer 308 may be in the solid phase, can be compatible with the manufacturing process flow, and can be etched using, for example, anisotropic or isotropic etching. The layer 308 has a different n than the surrounding medium. For example, the layer 308 may have n>2. The layer 308 may provide high index contrast with the surrounding structure after further processing, such as after the tungsten is removed.

In FIG. 5C, a portion of the layer 308 is removed. Some or a majority of the layer 308 is removed from the walls of the 3D NAND stacks 303. The removal may be, for example, an isotropic etch. A portion of the layer 308 remains on the separation structure 307. Thus, a portion of the layer 308 is removed and a portion of the layer 308 remains disposed on the separation structure 307. The portion of the layer 308 remaining on the separation structure 307 after at least some is removed can have a thickness from, for example, 1 nm to 500 nm (including all ranges and values to the 0.1 nm therein). The removal may be configured to reduce damage to the layers of the 3D NAND stacks 303. The layer 308 amplifies detection of the separation structure 307.

In FIG. 5D, the layers of tungsten 302 are removed. This may occur using a tungsten etch. The separation structure 307 can be preserved by the layer 308.

Figure 6:
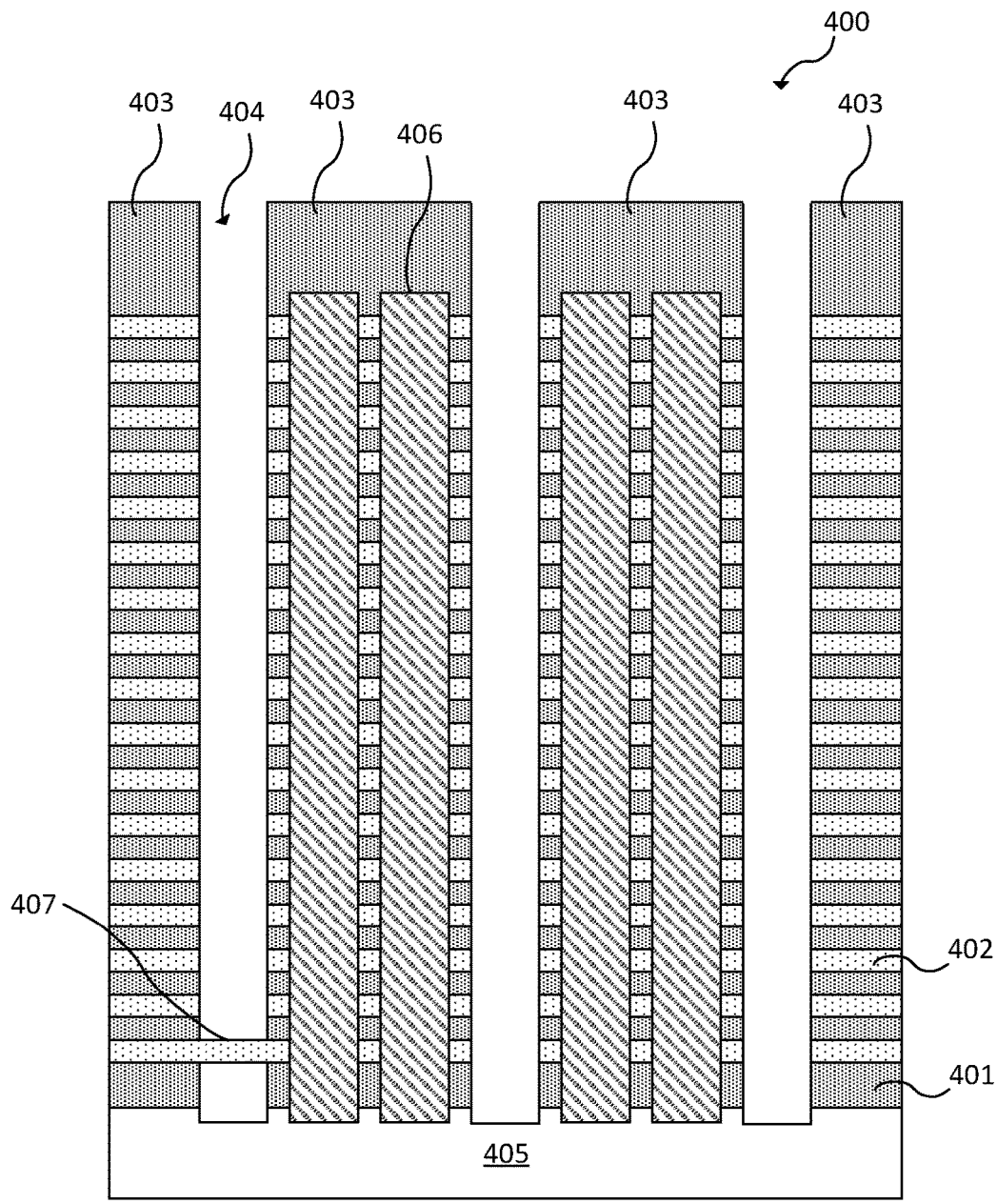
FIG. 6 is an exemplary cross-sectional view of a tungsten fill and etch layer of a 3D NAND stack with a channel bridge.

FIG. 6 is an exemplary cross-sectional view of tungsten fill and etch layer of a 3D NAND stack 403 with a channel bridge 407. The 3D NAND stacks 403 are disposed on a substrate 405, which may be silicon or other materials. The 3D NAND stacks 403 are made of alternating layers of silicon oxide 401 and tungsten 402. The 3D NAND stacks 403 can include one or more pillars 406 made of polysilicon. The materials in the various layers are designated using hatching or stippling. Other materials or other types of layers can be included. In the example of FIG. 6, the channel bridge 407 is made of tungsten.

Figure 7:
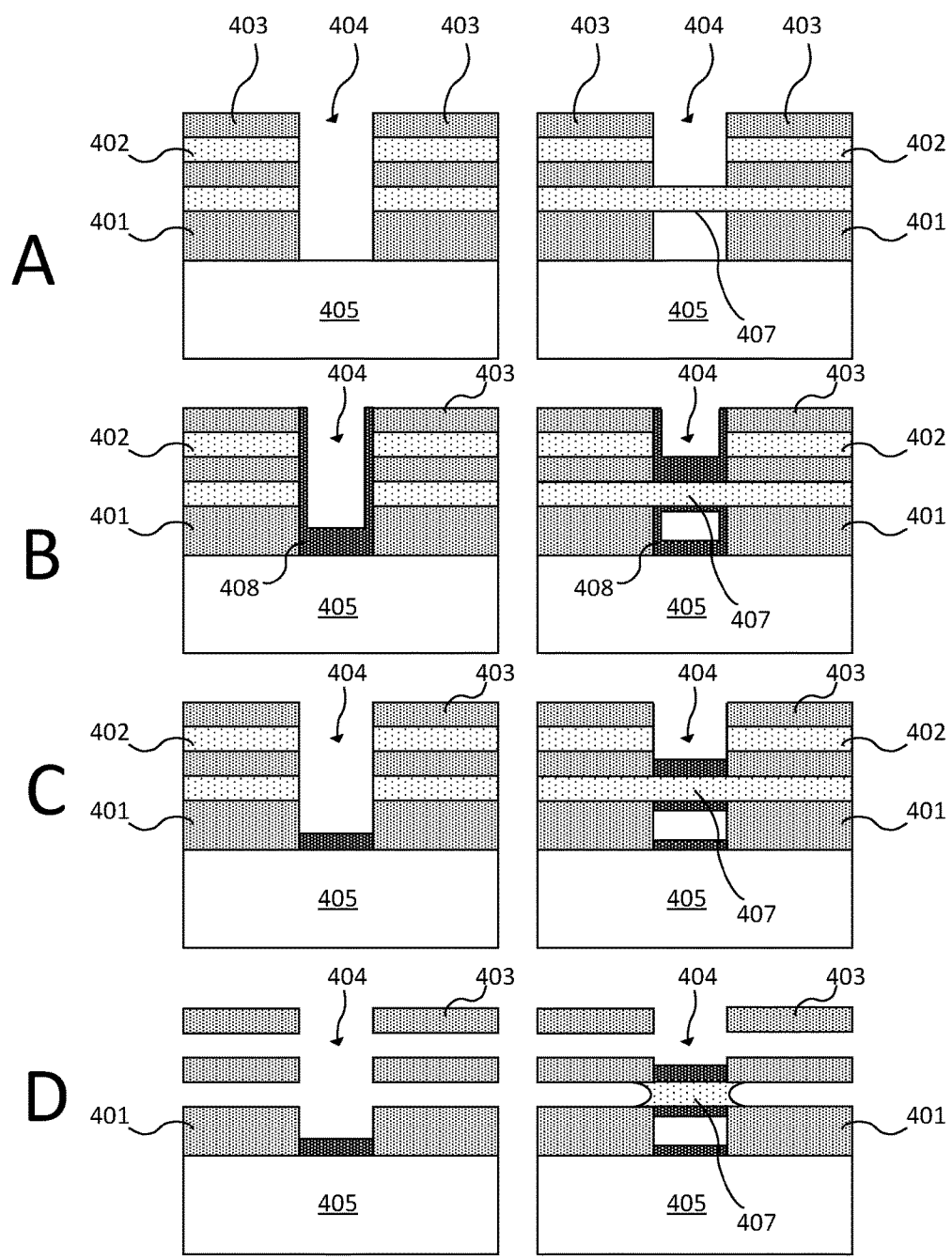
FIG. 7 is an embodiment of a process flow in accordance with the present disclosure using the 3D NAND stack of FIG. 6.

FIG. 7 is an embodiment of a process flow using the 3D NAND stack 403 of FIG. 6. As seen in FIG. 7A, two channels 404 are illustrated for comparison. One channel 404 includes a channel bridge 407 and the other does not. In FIG. 7B, a layer 408 of material is added in the channel 404 on the base and walls of the 3D NAND stacks 403. The layer 408 may have a thickness from greater than 1 nm to 550 nm (including all ranges and values to the 0.1 nm therein), though other dimensions are possible. The layer 408 also is added on the channel bridge 408. The layer 408 may be added by, for example, anisotropic deposition. The thickness of the layer 408 may be larger on the base of the channel 404 or on the channel bridge 407 than on the walls of the 3D NAND stack 403.

In this example, the layer 408 is silicon nitride. However, the layer 408 also can be polysilicon, titanium dioxide, amorphous carbon, hafnium oxide, magnesium oxide, aluminum oxide, silicon carbide, tantalum pentoxide, or combinations thereof (e.g., with silicon nitride). The layer 408 may be in the solid phase, can be compatible with the manufacturing process flow, and can be etched using, for example, anisotropic or isotropic etching. The layer 408 has a different n than the surrounding medium. For example, the layer 408 may have n>2. The layer 408 may provide high index contrast with the surrounding structure after further processing, such as after the tungsten is removed.

In FIG. 7C, a portion of the layer 408 is removed. Some or a majority of the layer 408 is removed from the walls of the 3D NAND stacks 403. The removal may be, for example, an isotropic etch. A portion of the layer 408 remains on the channel bridge 407. Thus, a portion of the layer 408 is removed and a portion of the layer 408 remains disposed on the channel bridge 407. The layer 408 may surround or encompass the channel bridge 407 in an instance. The portion of the layer 408 remaining on the channel bridge 407 after at least some is removed can have a thickness from, for example, 1 nm to 500 nm (including all ranges and values to the 0.1 nm therein). The removal may be configured to reduce damage to the layers of the 3D NAND stacks 403. The layer 408 amplifies detection of the channel bridge 407.

In FIG. 7D, the layers of tungsten 402 are removed. This may occur using a tungsten etch. The channel bridge 407 can be preserved by the layer 408.

Figure 8:
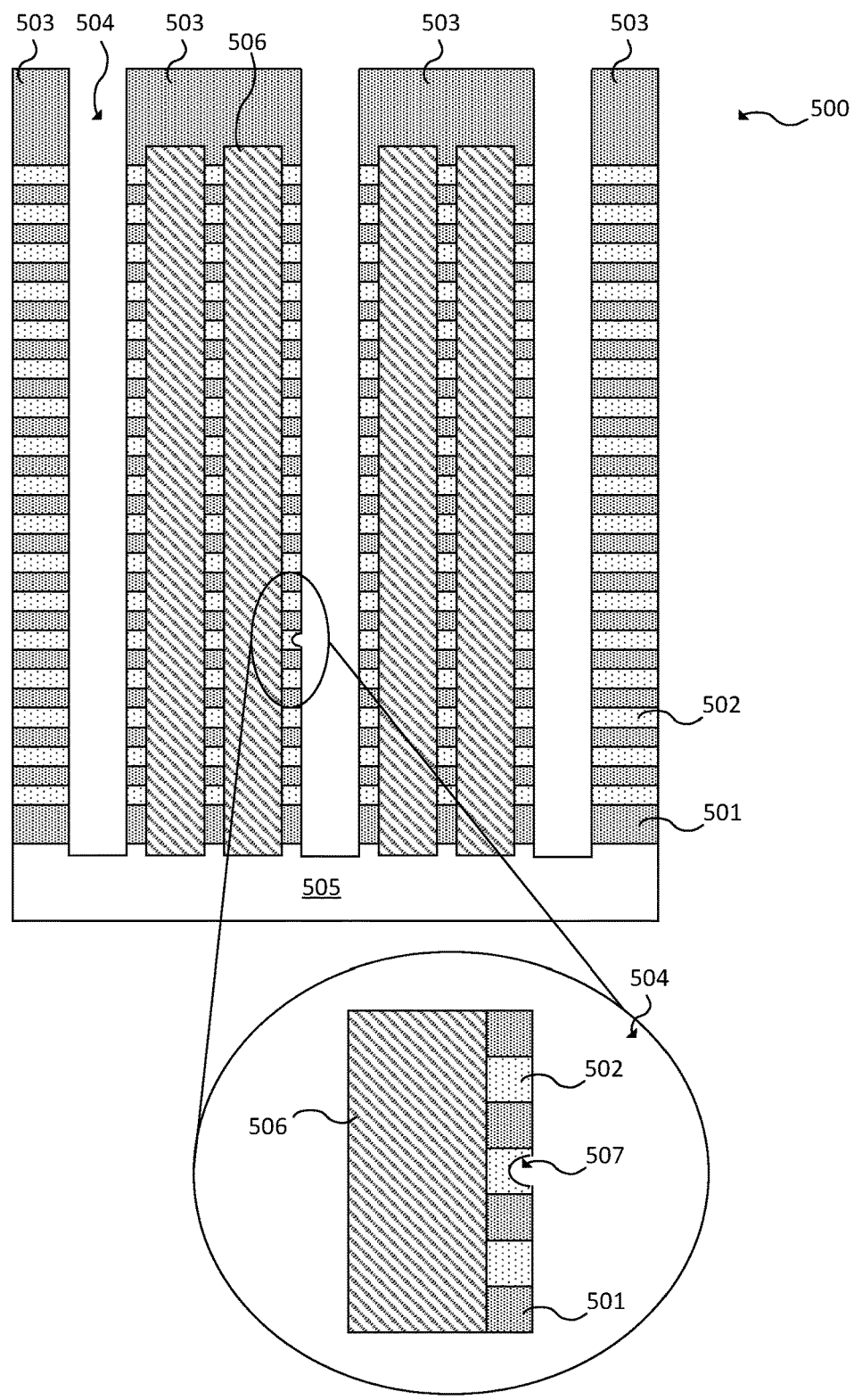
FIG. 8 is an exemplary cross-sectional view of a tungsten fill and etch layer of a 3D NAND stack with a tungsten void.

There are types of defects that do not have an adequate detection solution in the 3D NAND space. One 3D NAND defect example that does not currently have an adequate detection solution is a tungsten void. FIG. 8 is an exemplary cross-sectional view of tungsten fill and etch layer of a 3D NAND stack 503 with a tungsten void 507. The 3D NAND stacks 503 are disposed on a substrate 505, which may be silicon or other materials. The 3D NAND stacks 503 are made of alternating layers of silicon oxide 501 and tungsten 502. One or more pillars 506 made of polysilicon may be in the 3D NAND stacks 503. The materials in the various layers are designated using hatching or stippling. Other materials or other types of layers can be included. The tungsten void 507 is shown in the inset. The tungsten void may have dimensions from, for example, 10-100 nm. Part of the tungsten layer 502 did not form, which causes the tungsten void 507. A tungsten void 507 can occur due to causes such as silicon nitride residue from a previous manufacturing step blocking tungsten deposition, silicon oxide re-depositing during the silicon nitride step which subsequently blocks tungsten deposition, and/or the tungsten deposition pinching off and causing a void.

The existence to multiple layers of tungsten and thin channels (e.g., ~100 nm in width) can severely limit the light that can penetrate down to the defect. If there is no light to interact with the defect, there is effectively no way to optically obtain a signal of the defect for detection. Even detection using longer wavelengths (~900 nm) is still limited to approximately 1 μm depth in the channel. If a tungsten void is located near the bottom of the 3D NAND stack 503 (e.g., 3-4 μm thickness of the total stack from the substrate 505 to the surface of the structure), it is impossible to optically detect using current tools or even using a high landing energy SEM. Longer wavelengths may not solve the light penetration issue. eTest may be able to detect tungsten voids, but eTest is typically more expensive and time consuming than performing extra deposition and removal steps as disclosed herein.

Figure 9:
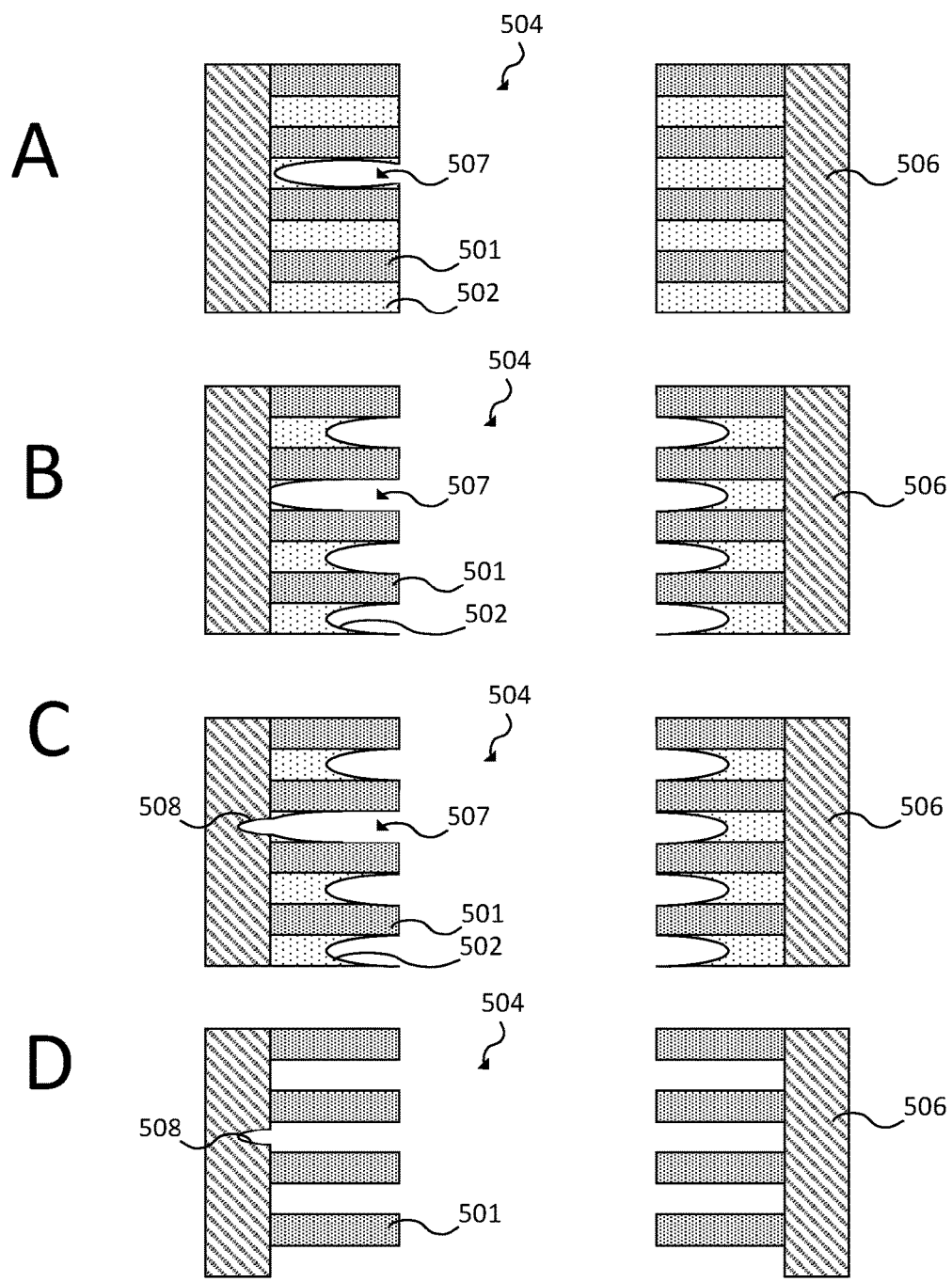
FIG. 9 is an embodiment of a process flow in accordance with the present disclosure using the 3D NAND stack of FIG. 8.

With reverse decoration, it is possible to amplify defect detection with tungsten voids. FIG. 9 is an embodiment of a process flow using the 3D NAND stack 503 of FIG. 8. In FIG. 9A, the initial structure are pillars 506, which can be made of polysilicon, surrounded by silicon oxide 501 and tungsten 502. A channel 504 is illustrated passing between the pillars 506. There is a tungsten void 507 exposed in the channel 507. In FIG. 9B, a first tungsten etch is performed, which exposes a surface of the pillar 506. This first tungsten etch may be a timed isotropic etch. Not all the tungsten 502 is removed during this first tungsten etch. In FIG. 9C, a silicon etch is performed. While tungsten 502 remains in most areas as a protective barrier, the silicon etch in FIG. 9C forms a defect 508 in the exposed surface of the pillar 506. Thus, a polysilicon void can be formed. In FIG. 9D, a second tungsten etch is performed, which removes the rest of the tungsten and, consequently, a limiting factor of light penetration. Using the technique illustrated in FIG. 9, the polysilicon void is preserved and can be used for defect detection of the original tungsten void 507. Polysilicon voids, such as those in FIG. 9D, can be detected using longer wavelengths (~900 nm). Thus, the tungsten void 507 can be detected by the presence of the polysilicon void.

Figure 10:
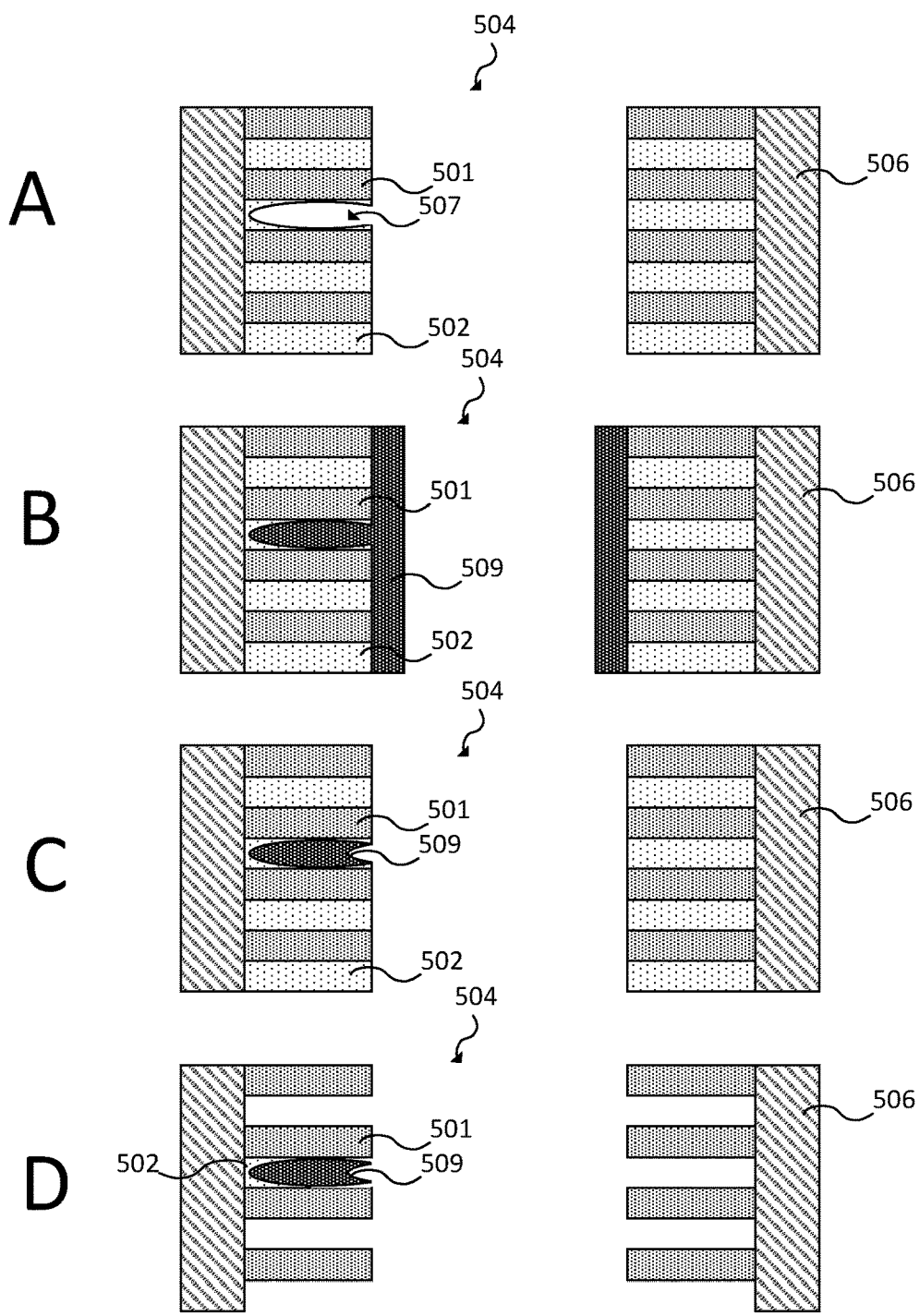
FIG. 10 is an embodiment of a process flow in accordance with the present disclosure using the 3D NAND stack of FIG. 8.

Reverse decoration also can amplify defect detection by depositing silicon nitride. FIG. 10 is an embodiment of a process flow using the 3D NAND stack 503 of FIG. 8. In FIG. 10A, the initial structure are pillars 506, which can be made of polysilicon, surrounded by silicon oxide 501 and tungsten 502. A channel 504 is illustrated passing between the pillars 506. There is a tungsten void 507 exposed to the channel 507.

In FIG. 10B, a layer 509 of material is added in the channel 504 on at least the walls of the 3D NAND stacks 503. The layer 509 may have a thickness from greater than 1 nm to 550 nm (including all ranges and values to the 0.1 nm therein), though other dimensions are possible. The layer 509 also is deposited in the tungsten void 507. The layer 509 may be added by, for example, isotropic deposition.

In this example, the layer 509 is silicon nitride, but also can be another high index dielectric material. However, the layer 509 also can be polysilicon, titanium dioxide, amorphous carbon, hafnium oxide, magnesium oxide, aluminum oxide, silicon carbide, tantalum pentoxide, or combinations thereof (e.g., with silicon nitride). The layer 509 may be in the solid phase, can be compatible with the manufacturing process flow, and can be etched using, for example, anisotropic or isotropic etching. The layer 509 has a different n than the surrounding medium. For example, the layer 509 may have n>2. The layer 509 may provide high index contrast with the surrounding structure after further processing, such as after the tungsten is removed.

In FIG. 10C, a portion of the layer 509 is removed. Some or a majority of the layer 509 is removed from the walls of the 3D NAND stacks 503, though the tungsten void 507 remains at least partly filled with the layer 509. Thus, a portion of the layer 509 is removed and a portion of the layer 509 remains disposed on the tungsten void 507. Some of the layer 509 may be removed from the tungsten void 507 during the removing, but a majority of the layer 509 or enough of the layer 509 to protect the pillar 506 may remain. The portion of the layer 509 remaining on or in the tungsten void 507 after at least some is removed can have a thickness from, for example, 1 nm to 500 nm (including all ranges and values to the 0.1 nm therein). The removal may be, for example, a dry etch or a timed isotropic etch that relies on diffusion. The removal may be configured to reduce damage to the layers of the 3D NAND stacks 503. The layer 509 amplifies detection of the tungsten void 507.

In FIG. 10D, the layers of tungsten 502 are removed. This may occur using a tungsten etch and may be one step or may be two steps (as seen in FIG. 9). However, the tungsten void 507 and some of the tungsten 502 proximate the tungsten void 507 is preserved by the layer 509. The material of the layer 509 can be configured to improve detection sensitivity, even if the tungsten void 507 is located near the substrate 505. For example, the material 509 may be a high index material. The material 509 or the material 509 with the tungsten 502 can scatter or absorb light during detection.

Figure 11:
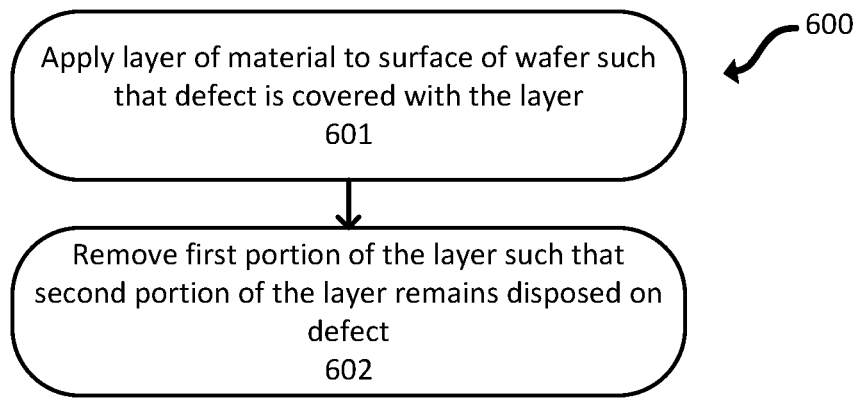
FIGS. 11-14 are embodiments of methods in accordance with the present disclosure.
Figure 12:
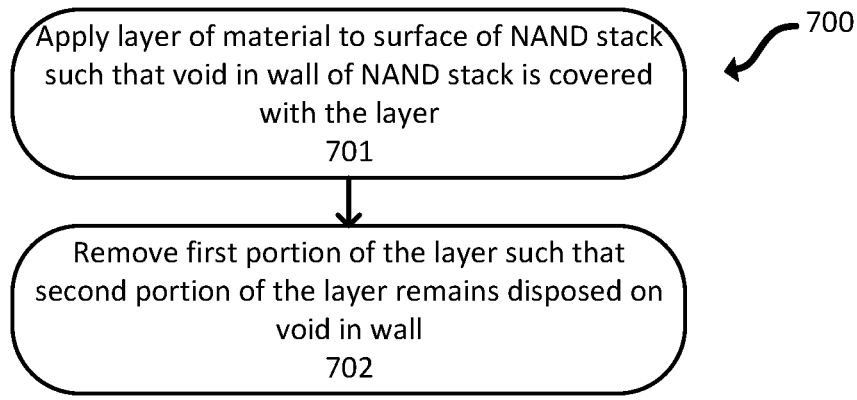
Figure 13:
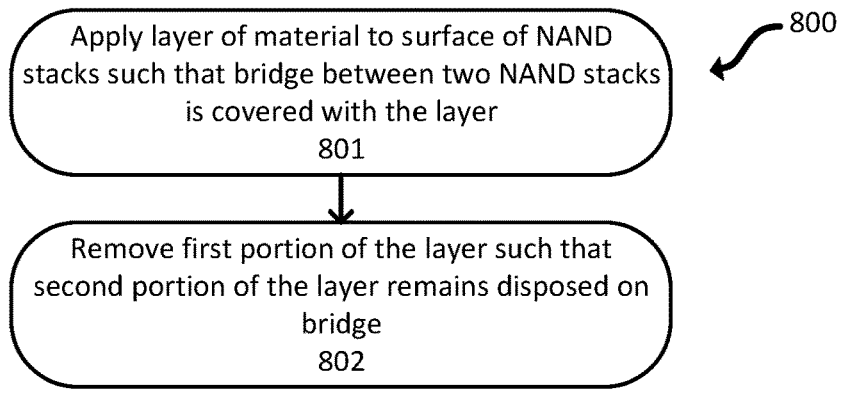

FIGS. 11-13 are embodiments of methods in accordance with the present disclosure. In method 600 illustrated in FIG. 11, a layer of a material is applied 601 on a surface of a wafer, such as by depositing, such that a defect on the wafer is covered with the layer. The material may be silicon nitride, polysilicon, titanium dioxide, amorphous carbon, hafnium oxide, magnesium oxide, aluminum oxide, silicon carbide, tantalum pentoxide, or a combination thereof. The wafer can include, for example, a NAND stack, a tungsten structure, or a copper structure. The defect can be a void, a bridge, a separation, or some other kind of defect. The material can be configured to amplify detection of the defect. A first portion of the layer is removed 602, such as by etching or CMP. A second portion of the layer can be configured to remain disposed on the defect after the removing. The material can preserve the defect during the removing. The defect is detected after the first portion of the layer is removed 602. For example, amplification of 2x or more may be possible depending on the quality of the materials, surrounding structures, and process flow.

In method 700 illustrated in FIG. 12, a layer of a material is applied 701 on a surface of a wafer such that a defect on the wafer is covered with the layer. The surface of the wafer can include a NAND stack and the defect can be a void in a wall of the NAND stack. The material can be configured to amplify detection of the defect. A first portion of the layer is removed 702. A second portion of the layer can be configured to remain disposed on the defect after the removing. Applying can include isotropic deposition on the walls of the NAND stack and removing can include isotropic etching of the walls of the NAND stack. The material may be silicon nitride, polysilicon, titanium dioxide, amorphous carbon, hafnium oxide, magnesium oxide, aluminum oxide, silicon carbide, tantalum pentoxide, or a combination thereof. The defect is detected after the first portion of the layer is removed 702.

In the method 800 illustrated in FIG. 13, a layer of a material is applied 801 on a surface of a wafer such that a defect on the wafer is covered with the layer. The surface of the wafer can include a plurality of NAND stacks and the defect can be a bridge structure between two of the NAND stacks. The material is can be configured to amplify detection of the defect. A first portion of the layer is removed 802. A second portion of the layer can be configured to remain disposed on the defect after the removing. Applying can include isotropic deposition on the walls of the NAND stack and removing can include isotropic etching of the walls of the NAND stack. The material may be silicon nitride, polysilicon, titanium dioxide, amorphous carbon, hafnium oxide, magnesium oxide, aluminum oxide, silicon carbide, tantalum pentoxide, or a combination thereof. The defect is detected after the first portion of the layer is removed 802.

Figure 14:
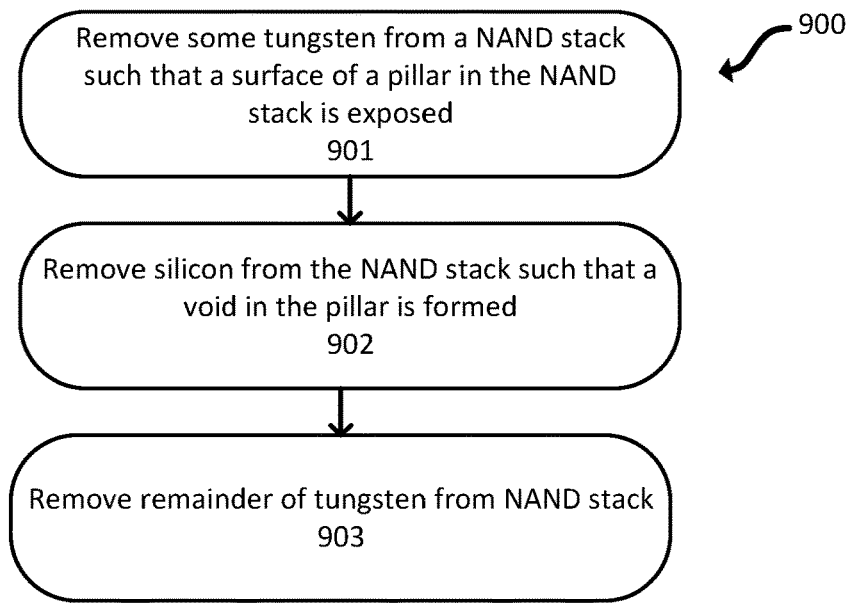

In the method 900 illustrated in FIG. 14, some tungsten is removed 901 from a NAND stack such that a surface of a pillar in the NAND stack is exposed. Silicon is removed 902 from the NAND stack such that a void in the pillar is formed. A remainder of the tungsten is removed 903 from the NAND stack.

Some examples of reverse decoration are disclosed herein, but reverse decoration techniques can be utilized on different layers or defects of interest (DOI) types.

Using reverse decoration, impact to devices or areas of the wafer without the defects is minimized or has no impact on device performance.

After reverse decoration, defects can be detected using various techniques. For example, optical inspection using a broad range of wafer inspection tools are enabled (e.g., 39xx, 29xx, 28xx, 23xx).

Various techniques to add material can be performed during reverse decoration. While deposition is disclosed, diffusion, molecular beam epitaxy (MBE), atomic layer deposition (ALD), or other techniques can be performed. The deposition can be furnace deposition, physical vapor deposition (PVD), chemical vapor deposition (CVD), electrochemical deposition (ECD), metalorganic chemical vapor deposition (MOCVD), or other techniques.

Material removal techniques for reverse decoration can include etching, CMP, or other techniques. Etching can include wet or dry etching.

Each of the steps of the method may be performed as described further herein. The steps may be performed on multiple tools within a semiconductor manufacturing facility. The methods also may include any other step(s) that can be performed by a controller and/or computer subsystem(s) or system(s). The steps can be performed by one or more computer systems, which may be configured according to any of the embodiments described herein. In addition, the methods described above may be performed by any of the systems for adding or removing described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
applying a layer of a material on a surface of a plurality of NAND stacks such that a bridge structure between two of the NAND stacks is covered with the layer, wherein the material has a refractive index different from that of the surface thereby amplifying detection of the bridge structure; and
removing a first portion of the layer from the plurality of NAND stacks, wherein a second portion of the layer remains disposed on the bridge structure after the removing.

2. The method of claim 1, wherein the applying includes anisotropic deposition on the walls of the NAND stacks, and wherein the removing includes isotropic etching of the walls of the NAND stacks.

3. The method of claim 1, wherein the material is silicon nitride, polysilicon, titanium dioxide, amorphous carbon, hafnium oxide, magnesium oxide, aluminum oxide, silicon carbide, tantalum pentoxide, or a combination thereof.

4. The method of claim 1, wherein the second portion of the layer remaining disposed on the bridge structure has a thickness from 1 nm to 500 nm.

5. The method of claim 1, wherein the refractive index of the material is greater than 2.

* * * * *